United States Patent [19]
Wolkstein

[11] Patent Number: 4,488,122
[45] Date of Patent: Dec. 11, 1984

[54] METHOD AND APPARATUS FOR COMPENSATING NON-LINEAR PHASE SHIFT THROUGH AN RF POWER AMPLIFIER

[75] Inventor: Herbert J. Wolkstein, Livingston, N.J.

[73] Assignee: RCA Corporation, New York, N.Y.

[21] Appl. No.: 437,837

[22] Filed: Oct. 29, 1982

[51] Int. Cl.³ .............................................. H03F 1/26
[52] U.S. Cl. ................... 330/149; 328/162; 333/24.1
[58] Field of Search ......................... 330/149; 328/162; 333/24.1, 24.3

[56] References Cited

U.S. PATENT DOCUMENTS

| | | | |
|---|---|---|---|
| 3,150,334 | 9/1964 | Petrossian | 333/24.3 |
| 3,332,042 | 7/1967 | Parris . | |
| 3,654,576 | 4/1972 | Buck . | |
| 3,747,031 | 7/1973 | Ohm . | |
| 3,755,754 | 8/1973 | Putz | 330/149 |
| 3,924,206 | 12/1975 | Fassett . | |

OTHER PUBLICATIONS

"A Magnetostatic Wave Signal-to-Noise Enhancer", by J. D. Adam and S. N. Stitzer, *Appl. Phys. Lett.*, 36(6), Mar. 15, 1980.
"Magnetostatic Surface Wave Signal-to-Noise Enhancer", by S. N. Stitzer, H. Goldie, J. D. Adam, P. R. Emtage, Westinghouse Electric Corporation.
"Magnetostatic Surface Wave Signal-to-Noise Enhancer", Westinghouse Defense and Electronic Systems Center Technical Report No. AFWAL-TR-80-1110, Oct. 1980.

*Primary Examiner*—Paul Gensler
*Attorney, Agent, or Firm*—J. S. Tripoli; R. L. Troike; R. E. Smiley

[57] ABSTRACT

A device comprising a microstrip including a narrow conductor connected in series between a circuit input terminal and the power amplifier, a film of ferrimagnetic material positioned adjacent the conductor and magnetic biasing means. The biasing means normally biases the ferrimagnetic material to operate at frequencies about a selected center frequency for nonlinearly enhancing RF input signals as a function of input amplitude. The device normally, undesirably provides non-linear phase shifts to the input signal as a function of input power at frequencies removed from the center frequency. By choice of the amount of the bias, for a particular input signal frequency, the device can be adjusted to produce phase shift which changes as a function of input power to offset the nonlinear phase shift of the RF amplifier.

6 Claims, 6 Drawing Figures

METHOD AND APPARATUS FOR COMPENSATING NON-LINEAR PHASE SHIFT THROUGH AN RF POWER AMPLIFIER

BACKGROUND OF THE INVENTION

This invention relates to predistortion circuits for radio frequency power amplifiers and more particularly to predistortion circuits utilizing ferrimagnetic materials.

Radio frequency (RF) power amplifiers for microwave communications systems are typically either traveling wave tube amplifiers (TWTA) or solid state power amplifiers (SSPA). Both amplifier types undesirably exhibit a phase shift to signal passage therethrough which changes as a function of input power. This change in phase shift is particularly undesirable in communications systems including satellite communications systems in that the change in phase shift causes signal distortion. Prior art attempts to reduce the change in phase shift by reducing input drive power and thus derating the power amplifier output power and by feedforward methods using an additional power amplifier for enhancing signal linearity are inefficient. Derating amplifier output power, given the usual requirement for a given operating output power level, is tantamount to using a larger TWTA or adding more SSPA power output stages, either of which is costly in hardware weight and volume. These methods require considerably more d.c. power and dissipation. For a satellite, this also requires more solar cells for sustaining the larger d.c. power load.

A device called a magnetostatic surface wave signal-to-noise enhancer has been reported in an article by the same name by S. N. Stitzer, J. D. Adam et al. in 1980 *IEEE MTT-S International Microwave Symposium Digest*, Washington, DC, May 28-30, 1980, (NY, USA-:IEEE 1980), pp. 238-240 and in an article entitled "A Magnetostatic Wave Signal-to-Noise Enhancer" by J. D. Adam and S. N. Stitzer in *Applied Physics Letters*, Vol. 36(6), Mar. 15, 1980, pp. 485-487. The signal-to-noise enhancer is a passive two port device which performs the function opposite that of a frequency selective microwave ferrite power limiter. In the enhancer strong (high powered) incoming signals are attenuated 20 to 30 dB less than are weak signals.

Such a device also has the normally undesirable property of phase shifting the signal passing therethrough by an amount which is a function of input power. This undesirable property is illustrated in a final report by the aforementioned Adams and Stitzer entitled "Magnetostatic Surface Wave Signal-to-Noise Enhancer" dated October 1980 and available from *Defense Technical Information Center*, Cameron Station, Alexandria, VA 22314, as Manual No. ADB054545. In FIG. 30B, page 39 thereof from which FIG. 6 of the instant application is an approximation, a series of relative phases at different input power levels and different frequencies are illustrated. From a review of that FIG. 30B and accompanying text it is understood that expected operation of the enhancer is over a wide bandwidth about a center frequency at various input power levels. At frequencies lower than the center frequency, there is a phase shift in one direction which changes as a function of input power and at frequencies higher than the center frequency there is a phase shift which changes in the opposite direction as a function of input power. Such phase shift changes, while not desired, are tolerated in the enhancer operation. The present invention, rather than merely tolerating the change in phase shift with input power, utilizes such change in phase shift as a function of input power for purposes of linearizing the system.

SUMMARY OF THE INVENTION

In accordance with a preferred embodiment of the present invention, a method for compensating for phase change through an RF power amplifier of a modulated input signal at a narrow frequency band applied thereto as a function of the amplification of the power of said input signal, utilizing a device comprising a microstrip including a narrow conductor having an input port and output port, ferrimagnetic material positioned adjacent said narrow conductor and magnetic biasing means providing an external magnetic field about the ferrimagnetic material comprises the steps of:

a. coupling the output port to the power amplifier and coupling the input signal to the input port; and b. magnetically biasing the ferrimagnetic material in an amount to cause a signal at the narrow frequency band passing along the conductor to shift phase by an amount which is a function of the power of the input signal applied thereto, the direction of phase shift being opposite to the phase shift change as a function of input power of the power amplifier.

DESCRIPTION OF THE PREFERRED EMBODIMENT

Figure 1:
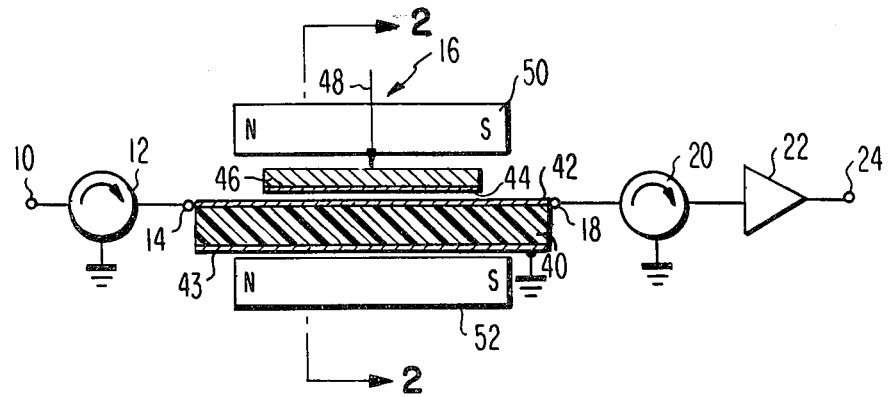
FIG. 1 is a block diagram of an RF power amplifier and a sectional side elevation view of a ferrimagnetic predistortion device for use therewith in accordance with a preferred embodiment of the invention.

With reference to FIG. 1, circuit input terminal 10 is coupled to one port of a conventional three port circulator 12. A second port is coupled to input terminal 14 of a predistortion device 16 while the third port is coupled to circuit ground. Device 16 is of the type conventionally used as a magnetostatic surface wave signal-to-noise enhancer which may be of the type described in detail in the aforementioned articles by Adam and Stitzer and the Defense Technical Information report by Stitzer. An output port 18 of device 16 is coupled to one port of a second conventional three port circulator 20. A second port is coupled to an RF power amplifier 22. The third port of circulator 20 is coupled to circuit ground. The output of amplifier 22 is coupled to circuit output terminal 24.

Amplifier 22 may typically be a commercially available TWTA or a SSPA of the type described in "Traveling Wave Tubes for Communication Satellites," by Robert Strauss, Jork Bretting, Robert Metivier, *Proceedings of the IEEE*, March 1977 and "Solid-State Power Amplifiers Replacing TWTs in C-Band Satellites," by H. J. Wolkstein and J. N. LaPrade, *RCA Engineer*, September/October 1982, pp. 7-16, respectively. Such amplifiers, by way of example, may operate over a range of carrier frequencies from 3.7 to 4.2 GHz in C-band and 11.7 to 12.2 GHz in K-band. When used for commercial microwave communications purposes utilizing a plurality of such circuits as illustrated in FIG. 1, each circuit operates at a specific carrier frequency or over a narrow band of such frequencies constituting an operating channel. A typical channel is of 37 MHz bandwidth. Such operation allows for the use of circuit device 16 as will be hereinafter described.

Figure 4:
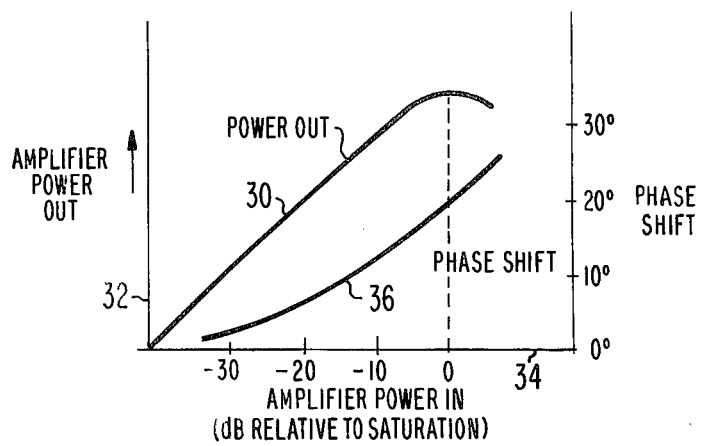

Amplifier 22 causes an undesirable phase shift to signal passage therethrough which changes as a function of input power. With reference to FIG. 4, waveform 30 represents power out from amplifier 22 of values indicated along ordinate 32 vs. input power to amplifier 22 of values indicated along abcissa 34. Curve 36 represents phase shift of signal passage through an SSPA 22 in degrees along ordinate 32 vs. power input to amplifier 22 in dB relative to saturation along abcissa 34. The change in phase shift as a function of input power is somewhat larger through a TWTA than through an SSPA but it is undesirably present in both types of amplifier.

By proper choice of materials and arrangement of the materials as hereinafter described, device 16 can be designed to predistort the input signal applied at circuit terminal 10 to compensate for changing phase shift through amplifier 22 such that there is a given fixed phase shift at all input power levels for signals passing from terminal 10 to terminal 24.

Figure 2:
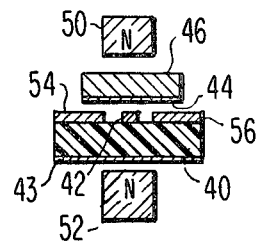
FIG. 2 is an end cross-sectional view of the predistortion device of FIG. 1 taken along lines 2—2 thereof.

With reference now to device 16 as illustrated in cross section side elevation view in FIG. 1 and cross section end elevation view in FIG. 2, the device comprises a microstrip substrate 40 below which is a groundplane 43 coupled to a ground or reference potential and above which is centered a straight through section of a narrow (relative to groundplane 43) conductor 42 extending from input port 14 to output port 18. A thin film 44 of single crystal yttrium iron garnet (YIG) which is grown on a gadolinium-gallium-garnet (GGG) substrate 46 is placed above conductor 42 in direct contact with it. The YIG-GGG combination which may be circular in shape as viewed in the direction of arrow 48 is illustrated elevated from the conductor for reasons of drawing clarity. At an exemplary frequency range of 3.7-4.2 GHz the thickness (top-to-bottom dimension in FIG. 2) of YIG may be 21.4 micrometers ($\mu M$), and the YIG film diameter may be 1 centimeter. The saturation magnetization ($4\pi Ms$) of YIG is ~1700 gauss. The gyromagnetic ratio of ferrimagnetic material including YIG is 1.4· g MHz/Orsted where the g factor is typically at or near 2. For one exemplary YIG, g=1.97±1%. The length from port 14 to port 18 may be 1.3 centimeters, and the dielectric constant of substrate 40 may be 70. The width and height of conductor 42 as seen in FIG. 2 may both be 25 $\mu M$. The thickness of dielectric media 40 affects the impedance of the conductor 42 for matching purposes. An exemplary thickness is 635 $\mu M$.

Bias magnets 50 and 52 are positioned respectively above and below YIG film 44. The bias magnets are oriented to provide an external uniform static magnetic field in the plane of the film 44 oriented parallel to conductor 42. A typical bias field strength H is 610 orsteds. With a suitably chosen bias field strength, magnetostatic surface waves (MSSW) within the designated frequency band can be launched into the YIG film by RF currents in the conductor 42. At low RF power levels, the excitation of MSSW is linear. The MSSW propagate at right angles away from the conductor 42 and toward the YIG and carry RF energy away from its vicinity, resulting in high insertion loss.

As RF currents in the conductor increase above some critical magnetic field strength, the spin wave amplitudes saturate, and the coupling between the conductor 42 and the MSSW decreases. A smaller proportion of the higher RF energy due to higher RF current in the conductor is carried away, resulting in lower insertion levels. The instant application makes use of the device for phase compensation at a frequency or narrow band of frequencies where the enhancer attenuation is relatively constant independent of signal strength.

If MSSW's reaching the edge of YIG film 44 are allowed to reflect back toward the conductor 42, RF will be coupled back into the conductor with some time delay. The effect will be a strong interference-fringe type ripple in the below-threshold frequency response curve. To prevent this effect, very thin films of aluminum or nichrome 54–56 (FIG. 2) are deposited on the microstrip substrate under the edge of the film 44. The gaps between conductor 42 and films 54, 56 are each about the same as the width of conductor 42 or about 25 $\mu m$.

Figure 5:
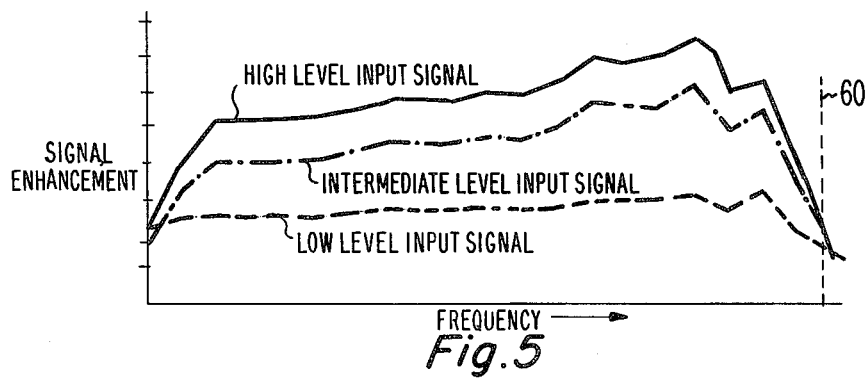

FIG. 5 serves to illustrate the operation of enhancer 16 in its prior art method of operation. Over some range of frequencies, for example from about 3 GHz to about 4 GHz, there is an increased output signal (lower attenuation) at higher levels of input signal relative to the output signal at low levels of input signal. As described in detail in the aforementioned article to S. N. Stitzer et al., given that device 16 is properly impedance matched to the preceding and following circuits, the frequencies at which the enhancer is operable is determined by the strength of magnetic bias field $H_o$ provided by bias magnets 50 and 52 (see FIGS. 1 and 2) in conjunction with the gyromagnetic ratio ($\gamma$) and saturation magnetization ($4\pi M_s$) of the YIG material. The low frequency cutoff in FIG. 5 is determined by the formula $$F_L = \gamma(H_o^2 + H_o 4\pi M_s)^{\frac{1}{2}} \tag{1}$$

while the high frequency cutoff is determined by the formula $$F_H = \gamma[H_o + (4\pi M_s \div 2)]. \tag{2}$$

Figure 6:
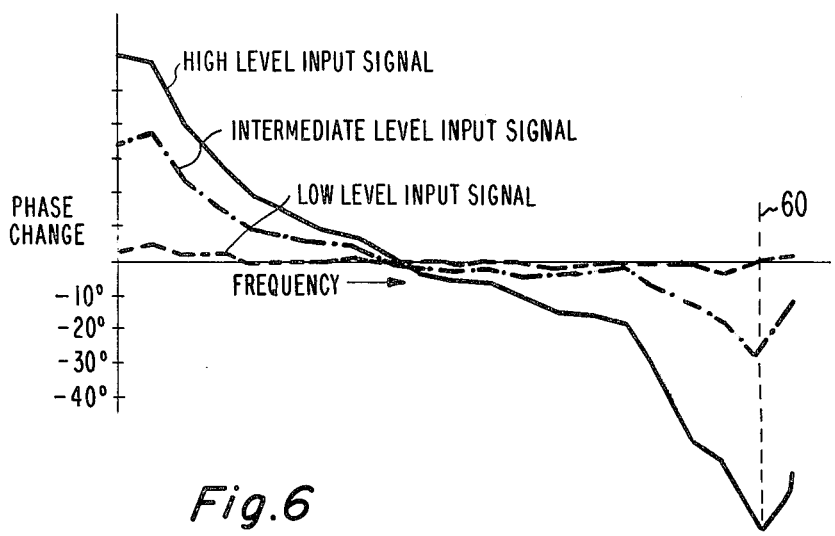

Since for YIG material $\gamma$ and $4\pi M$ are fixed, the high and low cutoff frequencies are adjusted by changing $H_o$. The waveforms of FIG. 6 show what normally is an undesirable property of such an enhancer. That is, there is a considerable phase change at different power levels and at different frequencies of input signal. From an observation of FIG. 5, it will be noted that at the low and high ends of the frequency spectrum, illustrated in FIG. 5 the enhancement does not differ from one level of input signal to another. Clearly one expecting to operate the enhancer as an enhancement device would prefer a frequency of operation in the middle of the illustrated range. However, with wide bandwidth signals this is not possible.

Figure 3:
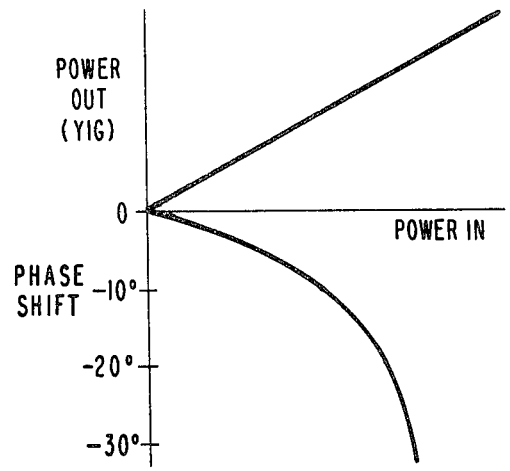
FIGS. 3 through 6 are sets of curves useful in understanding the operation of the circuit of FIG. 1.

For the purpose for which the enhancer is intended in the circuit of FIG. 1, desired operation for the limited channel bandwidth is near or along line 60, FIG. 6. It will be noted that along line 60 the phase changes in a negative direction with increasing levels of input power. From a review of FIG. 3, it will be noted that that is precisely the type of phase shift change with input power which is required to compensate for the positive change of phase with increasing input power to amplifier 22 (FIG. 1). This also takes place where the gain change as a function of drive is minimized. Thus by a proper choice of bias field, and of ferrimagnetic material having the desired value of saturation magnetization any given frequency may be chosen to provide a sufficiently wide range of phase shift with various levels of input powers to compensate for the phase shift change through amplifier 22 (FIG. 1).

The description of the enhancer 16 has been in terms of one using a YIG ferrimagnetic material. It will be understood that other types of ferrimagnetic material with different saturation magnetization values from those displayed by YIG material may also be utilized. Furthermore, permanent bias magnets 50 and 52 are illustrated in FIGS. 1 and 2. However, it will be understood that electromagnets may be utilized in place of the permanent magnets illustrated therein.

What is claimed is:

1. In a circuit for amplifying radio frequency (RF) signals at a narrow frequency band, comprising a power amplifier which imparts a non-uniform phase shift to signal passage therethrough as a function of input signal power and further comprising a microstrip including a narrow conductor connected to an input port and an output port, a layer of ferrimagnetic material adjacent said conductor and a magnetic bias means arranged to impart a magnetic field to said ferrimagnetic material, a method for compensating for said non-uniform phase shift, comprising steps of:
   a. coupling said output port to the input of said power amplifier and coupling said input port to receive said RF signals; and
   b. magnetically biasing said ferrimagnetic material in an amount to cause a signal at said narrow frequency band passing along said conductor to shift phase by an amount which is a function of the power of the input signal applied thereto and in a direction to oppose the non-uniform phase shift through said amplifier.

2. In a circuit for amplifying RF signals at a narrow frequency band comprising a power amplifier which imparts a non-uniform phase shift to signal passage therethrough as a function of input signal power, apparatus coupled to the input of said amplifier for compensating for said non-uniform phase shift through said amplifier, comprising in combination:
   a microstrip including a narrow conductor coupled at one end to the output to said amplifier and at the other end to the input of said circuit;
   a layer of ferrimagnetic material adjacent said conductor; and
   magnetic bias means arranged with said conductor and ferrimagnetic material to impart a magnetic field to encompass said ferrimagnetic material, said field being of such value to cause said RF signal at said narrow frequency band passing along said conductor to shift phase therethrough as a function of input signal power in a direction to offset the non-linear phase shift through said power amplifier.

3. The combination as set forth in claim 2 wherein said ferrimagnetic material is yttrium iron garnet (YIG).

4. The combination as set forth in claim 3 wherein said magnetic bias means is a permanent magnet.

5. The combination as set forth in claim 3 wherein said YIG, microstrip and magnetic bias means comprise a magnetostatic surface wave signal-to-noise enhancer.

6. The combination as set forth in claim 4 wherein said YIG, microstrip and permanent magnet comprise a magnetostatic surface wave signal-to-noise enhancer.

* * * * *